United States Patent
Clevenger et al.

(10) Patent No.: US 7,122,462 B2
(45) Date of Patent: Oct. 17, 2006

(54) BACK END INTERCONNECT WITH A SHAPED INTERFACE

(75) Inventors: Lawrence A. Clevenger, LaGrangeville, NY (US); Andrew P. Cowley, Wappingers Falls, NY (US); Timothy J. Dalton, Ridgefield, CT (US); Mark Hoinkis, Fishkill, NY (US); Steffen K. Kaldor, Fishkill, NY (US); Erdem Kaltalioglu, Fishkill, NY (US); Kaushik A. Kumar, Beacon, NY (US); Douglas C. La Tulipe, Jr., Danbury, CT (US); Jochen Schacht, Hsinchu (TW); Andrew H. Simon, Fishkill, NY (US); Terry A. Spooner, New Fairfield, CT (US); Yun-Yu Wang, Poughquag, NY (US); Clement H. Wann, Carmel, NY (US); Chih-Chao Yang, Beacon, NY (US)

(73) Assignees: International Business Machines Corporation, Armonk, NY (US); Infineon Technologies, AG, Munich (DE)

( * ) Notice: Subject to any disclaimer, the term of this patent is extended or adjusted under 35 U.S.C. 154(b) by 75 days.

(21) Appl. No.: 10/707,122

(22) Filed: Nov. 21, 2003

(65) Prior Publication Data
US 2005/0112864 A1  May 26, 2005

(51) Int. Cl.
*H01L 21/4763*  (2006.01)

(52) U.S. Cl. .................................. 438/622; 438/637
(58) Field of Classification Search ............... 438/622
See application file for complete search history.

(56) References Cited

U.S. PATENT DOCUMENTS

| | | | |
|---|---|---|---|
| 4,954,875 A | 9/1990 | Clements | |
| 5,841,196 A | 11/1998 | Gupta et al. | |
| 6,020,643 A | 2/2000 | Fukuzumi et al. | |
| 6,211,557 B1 | 4/2001 | Ko et al. | |
| 6,277,249 B1 * | 8/2001 | Gopalraja et al. | 204/192.12 |
| 6,396,141 B1 | 5/2002 | Schueller et al. | |
| 6,495,470 B1 | 12/2002 | Sadjadi et al. | |
| 6,607,977 B1 * | 8/2003 | Rozbicki et al. | 438/627 |
| 2004/0115928 A1 * | 6/2004 | Malhotra et al. | 438/639 |

FOREIGN PATENT DOCUMENTS

JP   2000332143   11/2000

* cited by examiner

Primary Examiner—Jack Chen
(74) Attorney, Agent, or Firm—Ira D. Blecker

(57) ABSTRACT

An interconnect structure in the back end of the line of an integrated circuit forms contacts between successive layers by removing material in the top surface of the lower interconnect in a cone-shaped aperture, the removal process extending through the liner of the upper aperture, and depositing a second liner extending down into the cone-shaped aperture, thereby increasing the mechanical strength of the contact, which then enhance the overall reliability of the integrated circuit.

5 Claims, 5 Drawing Sheets

US 7,122,462 B2

BACK END INTERCONNECT WITH A SHAPED INTERFACE

BACKGROUND OF INVENTION

1. Technical Field

The field of the invention is that of fabricating integrated circuits, in particular forming the interconnect structures in the back end of the line (BEOL).

2. Background of the Invention

In the course of developing copper interconnects for use in the back end of silicon, integrated circuits, it became necessary to encapsulate the copper interconnect material with a diffusion barrier in order to prevent the copper from escaping from the damascene channel. Because of the significant diffusion mobility of Cu atoms in most insulators, a small amount of Cu can cause serious short circuit problems in an integrated circuit. A small amount of Cu can further damage the function of devices completely when it diffuses into the well-defined implanted device areas.

Extensive work was done that resulted in a compatible system in which the copper was encased with a liner formed of a material having good diffusion blocking properties, such as one of the refractory metals, e.g. Ti, Ta or nitrides of those and similar metals.

However, these compounds have a high resistivity compared with copper and also have presented an electrical problem at the interface between adjacent back end layers.

A recurring problem with these interfaces is electromigration, in which atoms move under the influence of the electric field applied to the material. This material transport causes a significant number of circuit failures. The back end structures are built to carry electrical signals, of course, so that the existence and magnitude of the applied fields cannot be changed.

FIG. 1A illustrates a dual damascene structure in the prior art, in which a lower level 100, containing a copper interconnect 110 extending perpendicular to the plane of the paper has a cap layer 120. In the next layer above, interlevel dielectric (ILD) 130 has had a dual damascene aperture formed in it with a lower part 148 and a broader upper part 150. Illustratively, the ILD is silicon oxide or a low k dielectric such as SiLK, SiCOH, or any other kind of hybrid related materials. Aperture 148 is illustratively a via making contact with the lower structure and will be located at only a few locations. Upper portion 150 will extend over a significant distance to make contact with other elements of the circuit as required by the layout. In this figure, the portion of the cap layer 120 at the bottom of aperture 148 has been removed, usually by a different etching chemistry from that used to etch through the ILD.

Since the open surface of the metal underneath aperture 148 is a potential weak point, it is conventional to deposit a liner 160, shown in FIG. 1B, over the entire interior of the upper structure. Liner 160 may be TiN or a similar diffusion barrier, optionally including an adhesion layer that bonds well to the ILD. The liner is needed to confine the copper in the patterned ILD, i.e. both 150 and 148.

FIGS. 2A and 2B show similar figures for the case of a single damascene interconnect structure.

Problems with this prior art approach have been failure to make a good mechanical contact (leading to an open circuit or to a high resistance joint) at a chip operating temperature. Failures also include a poor electromigration resistance at the joint because of high resistivity that slows down the rise time of a signal or otherwise interferes with the electrical properties of the circuit.

SUMMARY OF INVENTION

The invention relates to an interconnect structure in the back end in which the material in a via penetrates for a considerable distance into the material of the underlying interconnect member.

A feature of the invention is the removal of the liner layer at the bottom of the via.

Another feature of the invention is the removal of material by forming a cone-shaped aperture in the lower material.

Yet another feature of the invention is the deposition of a first liner layer and, after removal of the liner at the bottom of the aperture, the deposition of a second liner layer.

Yet another feature of the invention is the simultaneous deposition of a material with the ion bombardment of the horizontal surfaces, so that the upper horizontal surfaces remain covered, while the surface at the bottom of the aperture is exposed.

DETAILED DESCRIPTION

Figure 1A:
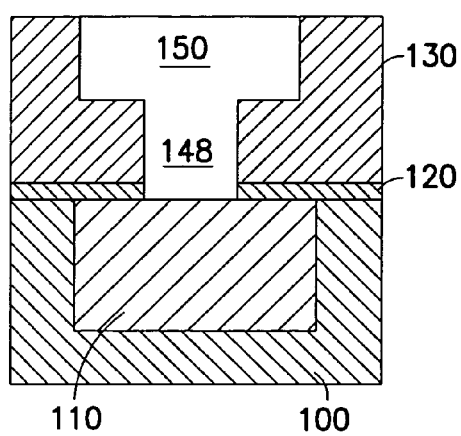
FIGS. 1A and 1B illustrate a prior art dual damascene structure.
Figure 1B:
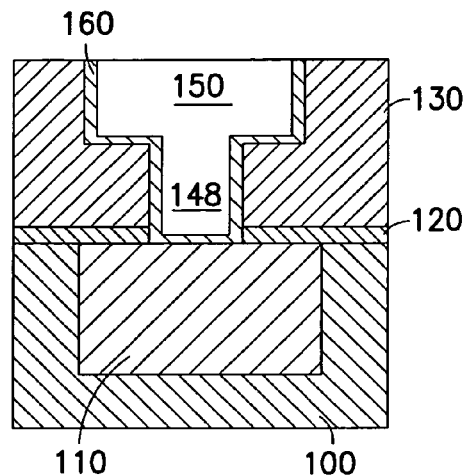
Figure 2A:
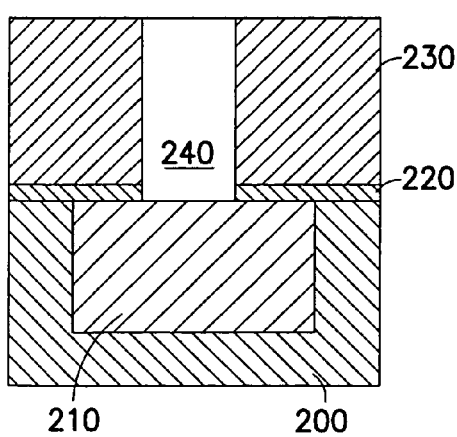
FIGS. 2A and 2B illustrate a prior art single damascene structure.
Figure 2B:
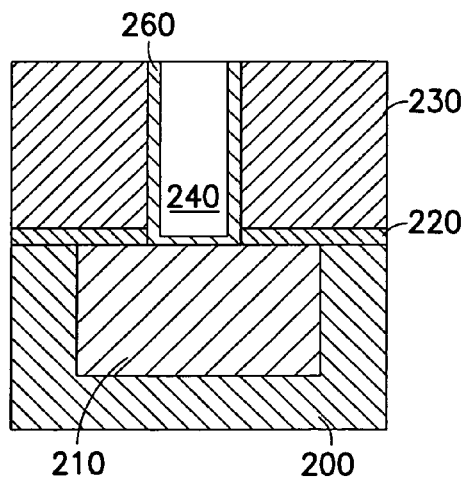
Figure 3:
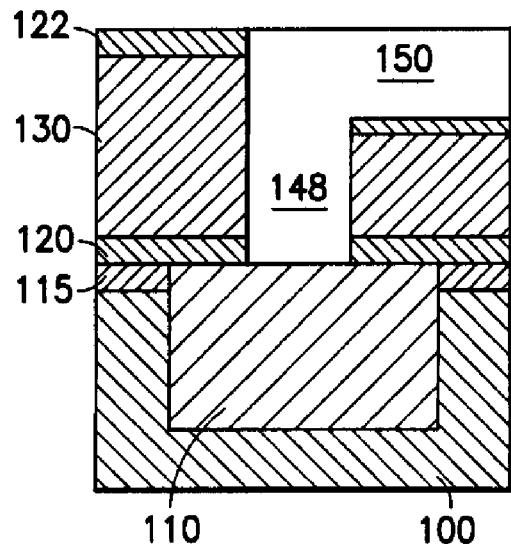
FIG. 3 illustrates a dual damascene structure after etching the damascene apertures.

FIG. 3 shows a cross section of a portion of the back end of an integrated circuit. Material 100 is illustratively an interlevel dielectric (ILD), e.g. oxide or a low-k material such as SiLK™, SiCOH, or any kinds of hybrid related materials. The region illustrated may be any level of interconnect, from the lowest, in which case, the lower metal piece 110 will rest on the substrate or any of the higher ones, in which case, there will be an interface between two levels of dielectric that each contain a set of interconnect lines.

Embedded in the ILD 100, is an interconnect member 110, e.g. a copper, aluminum, tungsten, line extending perpendicular to the plane of the paper. The process used to place the interconnect lines is the well known damascene process, in which an aperture is etched in the ILD filled with a conductor that is then polished level with the surface.

In the case of copper conductors, it is necessary that the copper be confined and a liner is formed around the underneath copper conductor. In FIG. 3, a portion of a cap layer 120 is shown that covers the top surface of the copper. Cap layer 120 has been etched through in the course of forming an aperture denoted 150 for the upper portion and 148 for the lower portion. A hard mask layer 115 that was used to define the lower metal interconnect member has been left in place.

Above the cap layer 120, an upper ILD 130 has had an aperture, denoted with numeral 150 for the upper portion and 148 for the lower portion, etched in it. This aperture is a dual damascene aperture, having an upper portion 150 that extends to the right at the top of the Figure and a via portion 148 that extends down to make contact with lower interconnect member 110. In this Figure, the via portion 148 exposes the top surface of interconnect member 110.

Figure 4:
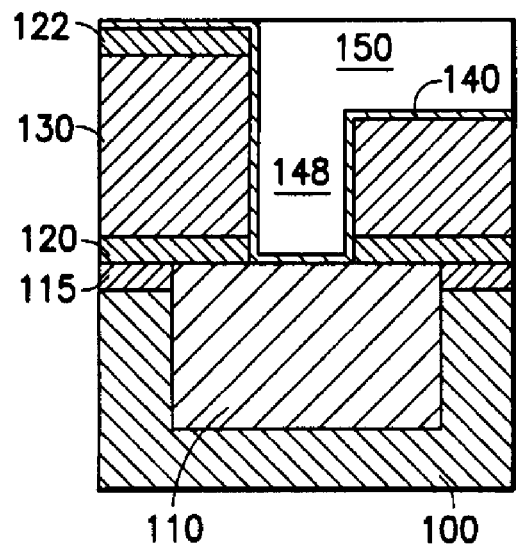
FIG. 4 illustrates the same structure after depositing a first liner material.

FIG. 4 shows the result of depositing a liner 140, illustratively TaN. In other versions of the process, the liner layer may include an adhesion layer such as Ti that makes a good bond with the ILD and/or with the copper interconnect material. The liner material is preferably TaN, Ta, Ti, TiN, TiN(Si) or W, although other materials may be used.

A significant problem in the process of forming a back end interconnect structure such as that illustrated in FIG. 3 is the mechanical and electrical connection between the bottom of the upper via and the top of the lower interconnect.

The thermal mismatch between Cu and the ILD material is significant, so that the thermal steps in the process tend to pull the joint between the interconnect levels apart. SiLK and other low-k ILDs tend to have a coefficient of thermal expansion that is greater than the copper. At one extreme, there can be an open circuit caused by mechanical separation between the lower interconnect and the bottom surface of the via.

In addition to mechanical separation, the liner materials have a higher resistivity than copper and impurities may be deposited in the via bottom, both of which increase the electrical resistance of the joint.

Figure 5:
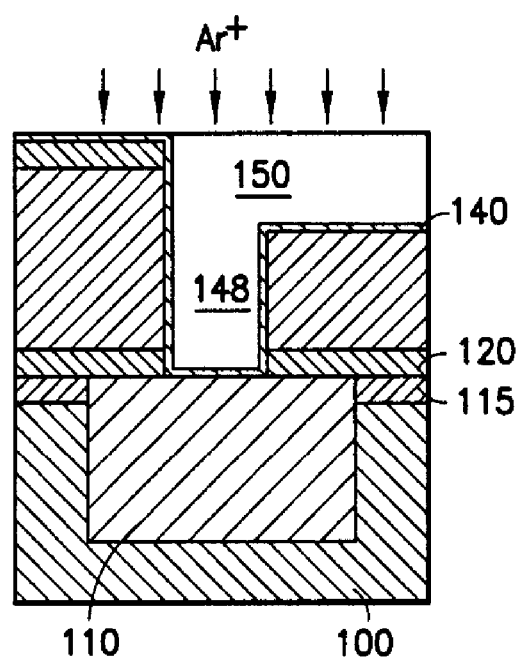
FIG. 5 illustrates the same structure undergoing a sputter process.

FIG. 5 shows the process of directing an ion bombardment, illustratively $Ar^+$, at the structure. The ions impinge preferentially on horizontal surfaces. It is desired to remove the liner 140 at the bottom of the via. Necessarily, the horizontal surface at the bottom of the horizontal portion of aperture 150 is also affected by the ion bombardment, and the liner material there may be removed also. The gas for ion bombardment or sputter-etching, can be selected from the group consisting of Ar, He, Ne, Xe, $N_2$, $H_2$, $NH_3$, $N_2H_2$.

Figure 6:
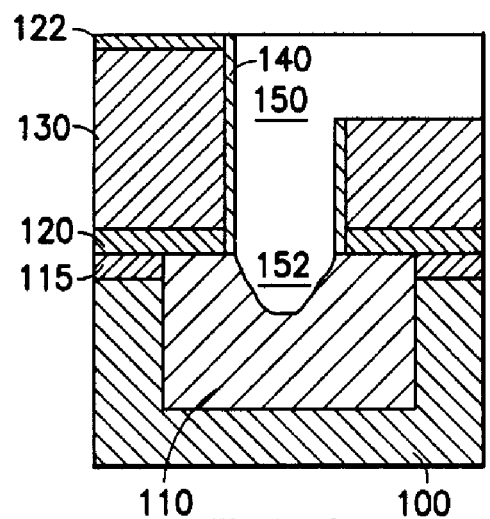
FIG. 6 illustrates the same structure after the underneath material removal.

FIG. 6 shows the structure after the ion bombardment, showing that the ions have not only removed the liner 140 at the bottom of the via, but may have also removed some material from lower interconnect member 110.

In an alternative embodiment of the invention, there is an option of performing an in-situ metal deposition during the ion bombardment. Although the etching rate is almost the same between the trench bottom and the via bottom, the deposition rate can be higher at the trench sites than the via sites, which then results in higher "net" etching rate at the via bottom. Thus, the desired result of opening the via's bottom while still protecting the extensive horizontal surface is preserved in a single step. Those skilled in the art will readily be able to select materials for deposition.

Aperture 152, at the bottom of the via, exposes new surface area and penetrates into the lower interconnect member. This physical penetration has resulted in a significant improvement in joint quality. Experimental results of a thermal stress test have shown that joints constructed according to the invention have shown no failures after 1000 hours, while joints with only a slight penetration in to the lower material, such as might occur during an overetch, exhibited a lower failure rate after 500 hours. In contrast, joints constructed according to the prior art, with the via not penetrating into the lower member showed extensive and commercially unacceptable failure rates after 250 hours test.

Figure 7:
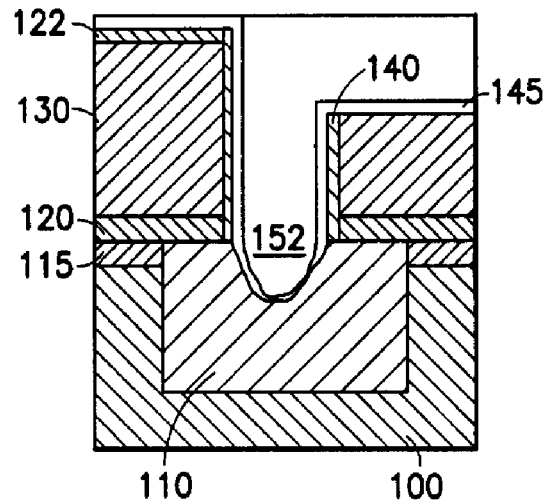
FIG. 7 illustrates the same structure after the deposition of a second liner layer.

FIG. 7 shows the structure after deposition of a second liner 145. The second liner covers the extensive horizontal surface of upper trench 150 in order to properly confine the copper. The bottom surface of the via is shown as being only partially covered with the second liner to illustrate that complete coverage here is not essential. Complete coverage at this via bottom surface is not required, i.e . . . it can be either fully covered with the second liner material, or partially. The second liner material is preferably selected from the group comprising TaN, Ta, Ti, TiN, TiN(Si) or W, although other material may be used.

If desired, the circuit designer could specify a process in which the via is filled with a temporary material such as photoresist or TEOS oxide that would block the deposition of the second liner layer at the bottom of aperture 152. The temporary material would be chosen so that it can easily be removed before filling the aperture 150 with the final conductive material. This approach would provide a metal to metal contact between the via and the lower interconnect. It has been found that this degree of contact is not required for the present technology and the process described, in which the bottom of aperture 152 is fully or partially coated with the second liner, is satisfactory.

FIGS. 8 through 12 illustrate a similar set of steps in an alternative process.

Figure 8:
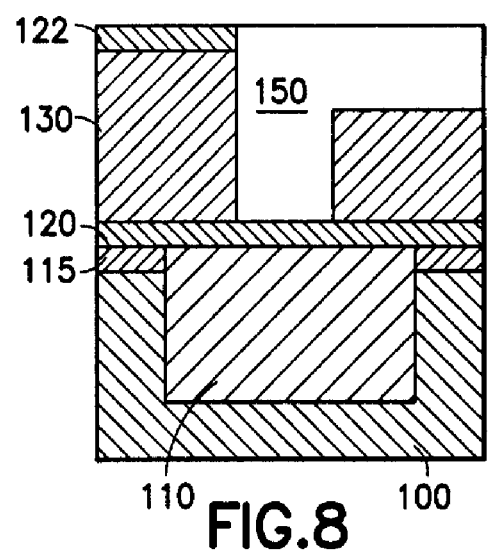
FIGS. 8–12 illustrate corresponding steps in an alternative embodiment of the invention.

FIG. 8 shows the structure at the same step as FIG. 3, differing in that the cap layer 120 has not been etched by the step that formed the damascene aperture, 150 for upper portion and 148 for lower portion. Those skilled in the art will appreciate that the cap layer is formed from a diffusion barrier such as TaN and the ILD is formed from oxide on a low-k material. The etching process can readily be specified with chemistry that stops on the cap layer, producing the result shown in FIG. 8.

Figure 9:
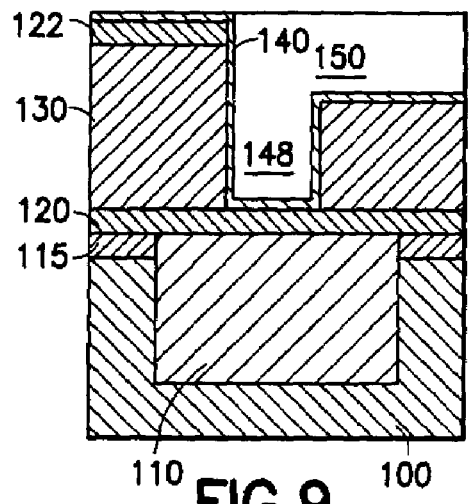

FIG. 9 shows the same structure with the liner 140 in place.

Figure 10:
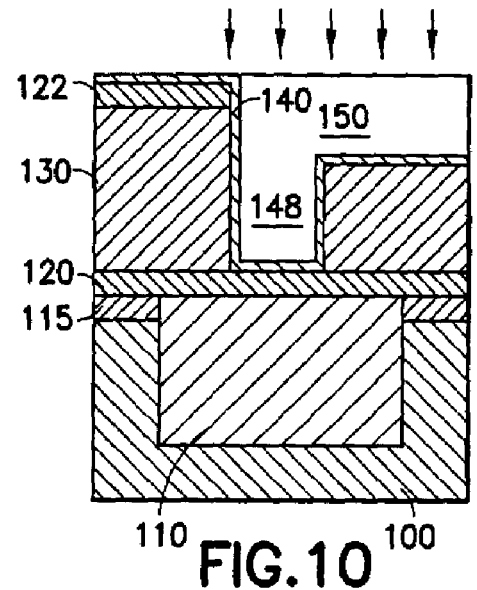

FIG. 10 shows the same bombardment with ions as in the previous method. In this case, the bombardment will remove not only the liner 140 at the bottom of the via, but also the cap layer 120.

Figure 11:
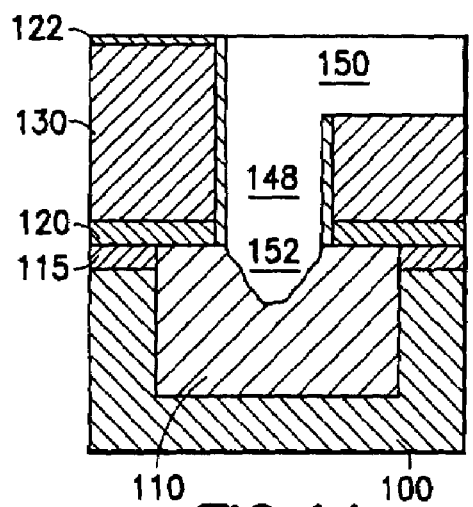

FIG. 11 shows the result of removing the liner 140 at bottom of the via 148, cap layer 120 and a cone of material at the bottom of the via, producing a lower aperture 152, similar to the previous method. It is possible that hard mask 122 at the top of the Figure has been reduced in thickness by the ion bombardment, although it may not always be true. There is an option to have an in-situ metal deposition during the ion bombardment process, which may result in only the liner 140 at the via bottom being removed away after the bombardment process.

As compared to the first approach, the major advantage of the second approach is to prevent the exposed underneath metal surface 110 from contamination and oxidation during the process transition between the ILD etch and the liner deposition, i.e. a surface contamination may occur in the first approach between the step shown in FIG. 3 and the step shown in FIG. 4.

Figure 12:
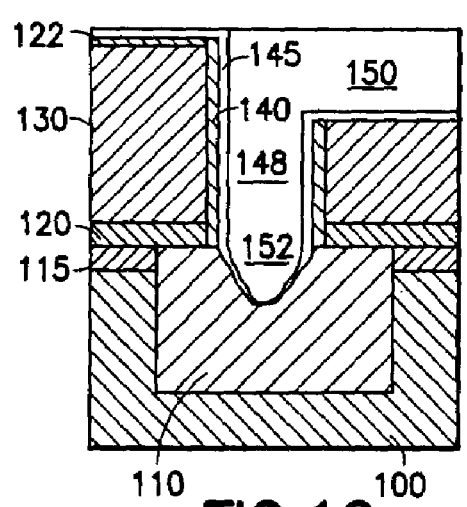

FIG. 12 shows the result of the second method, which produces the same final structure as the first method. An aperture 150 for the upper portion and 148 for the lower portion, is prepared for the deposition of the (copper) conductor in the damascene trench. A second liner 145 has been deposited, which thickens the liner on the vertical surfaces of the via.

It has been found that there is a significant dependence on the depth of the aperture 152 that penetrates into the material of the lower interconnect.

In the prior art, the goal of the processing was to avoid penetrating lower interconnect 110. There might be some slight penetration caused by overetching when forming the lower part of the aperture for the via, but proper procedure was considered to be stopping the etch on the cap layer. In fact, all the current tool manufacturing companies strongly disagree using the process of ion bombardment on the lower interconnect 100, because of the resputtering of the underneath material can significantly contaminate the processing chamber. The philosophy of the current invention disclosure here is totally different and opposite from all the current commercial processes.

It has been found that the penetration provided by the invention provides a significant advantage. Experimental results have shown that interconnect structures made according to the invention provide considerably better reliability and significantly lower failure rates than structures constructed according to the prior art.

Figure 13:
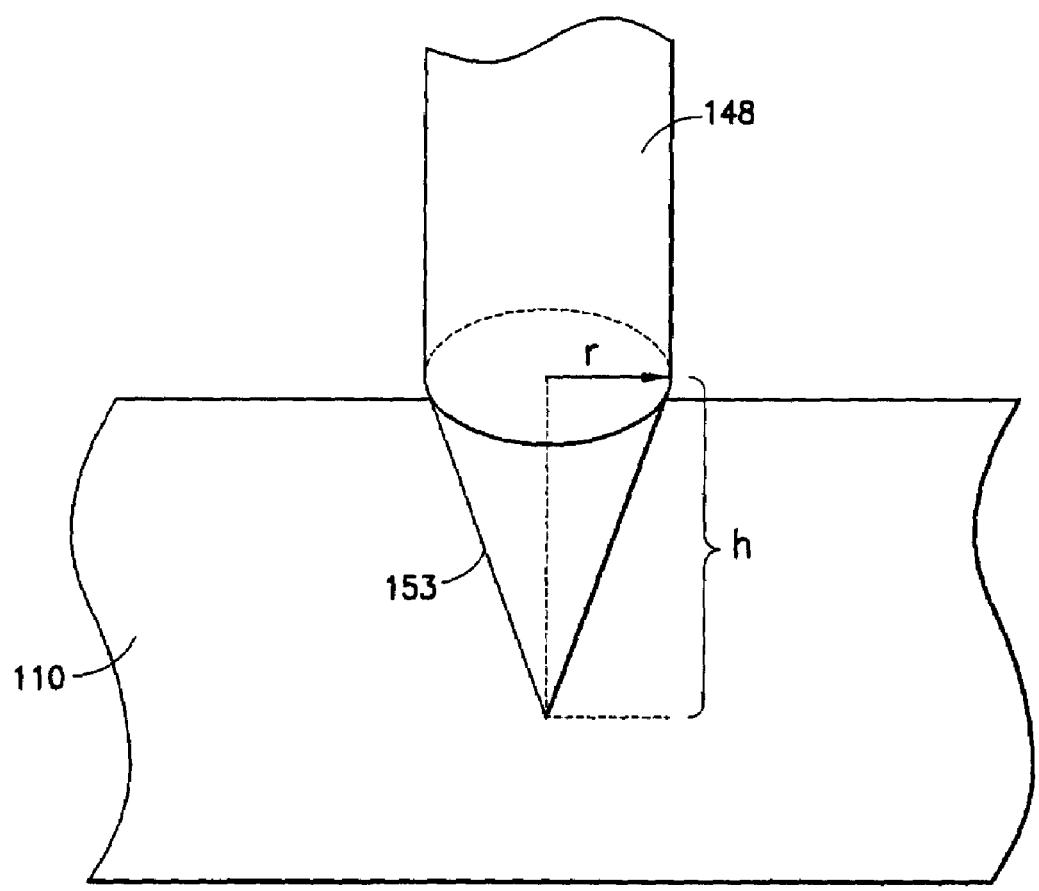
FIG. 13 illustrates a joint construction according to the invention.

Referring to FIG. 13, there is shown a simplified drawing of a joint constructed according to the invention. Via 148, extends down to meet lower interconnect member 110.

Numeral 153 denotes the surface of a cone that penetrates into member 110. The actual shape may be irregular, and the FIG. 13 shows a version, which is very close to a real case, of a penetrating aperture that has the general shape of a cone. The shape will be described generally as one having substantially no horizontal surfaces.

The cone has a radius r, (or half the diameter of the via). A distance h represents the height of the cone and is the primary variable that may be adjusted according to the invention, since the diameter of the via is fixed by the design rules for the current generation of processing.

It has been found that there is a threshold below which the penetration into the lower interconnect has no significant effect. It has been found that when h is less than r, i.e. half the diameter of the via, the failure rate is not significantly different from that of the prior art.

In general, the area of the cone-shaped surface 153 is given by $\pi r(r^2+h^2)^{1/2} - \pi r^2$. This quantity should be greater than the area ($\pi r^2$) of a flat-bottomed cylinder or radius r.

Further, it is preferable that h is $X > (3)^{0.5}$ times the radius in order for the benefits of the invention to become fully realized. Thus, the preferred embodiment of the invention is a generally cone-shaped penetration of the via into the lower interconnect that extends by the $(3)^{0.5}$ times the radius of the via.

The invention has been explained in the context of a metal interconnect with specified liner material, but those skilled in the art will appreciate that other materials having the same or similar properties may be used.

While the invention has been described in terms of a single preferred embodiment, those skilled in the art will recognize that the invention can be practiced in various versions within the spirit and scope of the following claims.

What is claimed is:

1. A method of forming an interconnect structure comprising the steps at:

providing a lower electrical contact including a lower interconnect member;

depositing an ILD and forming an interconnect aperture therein extending down to make contact with said lower interconnect member;

depositing a liner layer in said interconnect aperture;

removing said liner layer on at least the bottom surface of said interconnect aperture, thereby exposing a top surface of said lower interconnect member;

bombarding said top surface of said lower interconnect member with ions such that material is removed from the interface of said lower interconnect member and the bottom surface of said interconnect aperture in a generally cone shape having a height greater than the radius, thereby forming a second aperture within said lower interconnect member having a shape with substantially no horizontal surfaces; and depositing conductive material in said interconnect aperture, thereby establishing a joint between said lower interconnect member and an upper interconnect member formed by said conductive material in said interconnect aperture.

2. A method according to claim 1, in which the material of said lower interconnect member is selected from the group consisting of Cu, W, Al, and other conducting materials.

3. A method according to claim 1, in which the material of said liner layer deposited in said interconnect structure is selected from the group consisting of TaN, Ta, Ti, Ti(Si)N and W.

4. The method of claim 1, wherein a gas source for ion bombardment is selected from the group consisting of Ar, He, Ne, Xe, $N_2$, $H_2$, $NH_3$, $N_2H_2$.

5. A method of forming an interconnect structure comprising the steps of:

providing a lower electrical contact including a lower interconnect member;

depositing an ILD and forming an interconnect aperture therein extending down to make contact with said lower interconnect member;

depositing a liner layer in said interconnect aperture;

removing said liner layer on at least the bottom surface of said interconnect aperture, thereby exposing a top surface of said lower interconnect member;

bombarding said top surface of said lower interconnect member with ions such that material is removed from the interface of said lower interconnect member and the bottom surface of said interconnect aperture in a generally cone shape having a height greater than or equal to $(3)^{0.5}$ times a radius, thereby forming a second aperture within said lower interconnect member having a shape with substantially no horizontal surfaces; and depositing conductive material in said interconnect aperture, thereby establishing a joint between said lower interconnect member and an upper interconnect member formed by said conductive material in said interconnect aperture.

* * * * *